United States Patent
Tsao et al.

(10) Patent No.: US 8,828,745 B2
(45) Date of Patent: Sep. 9, 2014

(54) METHOD FOR MANUFACTURING THROUGH-SILICON VIA

(75) Inventors: Wei-Che Tsao, Tainan (TW); Chia-Lin Hsu, Tainan (TW); Jen-Chieh Lin, Kaohsiung (TW); Teng-Chun Tsai, Tainan (TW); Hsin-Kuo Hsu, Kaohsiung (TW); Ya-Hsueh Hsieh, Kaohsiung (TW); Ren-Peng Huang, Changhua County (TW); Chih-Hsien Chen, Miaoli County (TW); Wen-Chin Lin, Tainan (TW); Yung-Lun Hsieh, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 580 days.

(21) Appl. No.: 13/176,790

(22) Filed: Jul. 6, 2011

(65) Prior Publication Data

US 2013/0011938 A1 Jan. 10, 2013

(51) Int. Cl.
*H01L 21/66* (2006.01)
*H01L 21/306* (2006.01)
*H01L 21/304* (2006.01)
*H01L 21/768* (2006.01)
*H01L 21/3105* (2006.01)
*H01L 21/321* (2006.01)

(52) U.S. Cl.
CPC .... *H01L 21/31053* (2013.01); *H01L 21/76898* (2013.01); *H01L 22/26* (2013.01); *H01L 22/12* (2013.01); *H01L 21/3212* (2013.01)
USPC .......... 438/8; 438/10; 438/692; 257/E21.529; 257/E21.23

(58) Field of Classification Search
None
See application file for complete search history.

(56) References Cited

U.S. PATENT DOCUMENTS

| | | |
|---|---|---|
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |

(Continued)

OTHER PUBLICATIONS

U.S. Appl. No. 12/962,055, filed Dec. 7, 2010.

*Primary Examiner* — Seahvosh Nikmanesh
(74) *Attorney, Agent, or Firm* — WPAT, PC; Justin King

(57) ABSTRACT

A method for manufacturing TSVs, wherein the method comprises several steps as follows: A stack structure having a substrate and an ILD layer (inter layer dielectric layer) is provided, in which an opening penetrating through the ILD layer and further extending into the substrate is formed. After an insulator layer and a metal barrier layer are formed on the stack structure and the sidewalls of the opening, a top metal layer is then formed on the stack structure to fulfill the opening. A first planarization process stopping on the barrier layer is conducted to remove a portion of the top metal layer. A second planarization process stopping on the ILD layer is subsequently conducted to remove a portion of the metal barrier layer, a portion of the insulator layer and a portion of the top metal layer, wherein the second planarization process has a polishing endpoint determined by a light interferometry or a motor current.

8 Claims, 9 Drawing Sheets

(56) References Cited

U.S. PATENT DOCUMENTS

| | | |
|---|---|---|
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,890 B2 | 4/2003 | Miyake |
| 6,551,857 B2 | 4/2003 | Leedy |
| 6,627,985 B2 | 9/2003 | Huppenthal |
| 6,633,083 B2 | 10/2003 | Woo |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,564,115 B2 | 7/2009 | Chen |
| 7,732,926 B2 | 6/2010 | Uchiyama |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao et al. |
| 2008/0108193 A1 | 5/2008 | You |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0140749 A1 | 6/2010 | Kuo |
| 2010/0140772 A1 | 6/2010 | Lin |
| 2010/0323478 A1 | 12/2010 | Kuo |

METHOD FOR MANUFACTURING THROUGH-SILICON VIA

BACKGROUND OF THE INVENTION

1. Field of Invention

The present invention relates to a wafer level packaging technology. More particularly, the present invention relates to method for manufacturing Through-Silicon Vias (TSV).

2. Description of Related Art

With the advance of the semiconductor manufacturing technology, more and more devices are integrated into a semiconductor circuit. However, when more devices are involve in a 2-dimensional (2D) semiconductor circuits, it requires more space to accommodate the devices and needs longer wires to connect thereto. Besides, resistance-capacitance (RC) delay may occur and power consumption should be increased significantly, both may adversely affect the performance of the semiconductor circuit.

To resolve these problems, a system-on-chip (SoC) and/or system-in-package (SiP) technology are provided, wherein a 2D or 3-dimensional (3D) packaging structure is adopted to integrate devices in a single die. However, the conventional SoC and/or SiP technology still has drawbacks. Hence the 2D or 3D packaging technology still utilizes bonding wires or contact pads to connect the integrated devices, thus when more and more device is integrated on the die, the size of the die would be significantly increased and the performance thereof should be deteriorated.

Currently, a new 3D packaging technology-TSV is introduced to improve the aforementioned problems, wherein a TSV is an interconnection penetrating through at least one dielectric layer of a wafer or a die to provide an electrical contact to devices vertically aligned with each other and disposed in the wafer or the die. Hence the vertical interconnection can reduce the contact distance, thus the circuit complexity of the package structure would be reduced, and meanwhile the line width of the interconnections can be increased. Accordingly the speed of the devices should be enhanced and the power consumption should be reduced.

SUMMARY OF THE INVENTION

According to one aspect of the present invention, a method for manufacturing TSVs is provided, wherein the method comprises several steps as follows: A stack structure having a substrate and an ILD layer (inter layer dielectric layer) is provided, in which an opening penetrating through the ILD layer and further extending into the substrate is formed. After an insulator layer and a metal barrier layer are formed on the stack structure and the sidewalls of the opening, a top metal layer is then formed on the stack structure and fills the opening. A first planarization process stopping on the barrier layer is conducted to remove a portion of the top metal layer. A second planarization process stopping on the ILD layer is subsequently conducted to remove a portion of the metal barrier layer, a portion of the insulator layer and a portion of the top metal layer, wherein the second planarization process has a polishing endpoint determined by a light interferometry or a motor current.

In one embodiment of the present invention, the first planarization process comprises a chemical mechanical polishing (CMP) process having a polishing rate for removing the metal barrier layer less than a polishing rate for removing the top metal layer. In one embodiment of the present invention, the ratio of the polishing rate for removing the top metal layer to the polishing rate for removing the metal barrier layer is substantially greater than 2. In one embodiment of the present invention, the ratio of the polishing rate for removing the top metal layer to the polishing rate for removing the metal barrier layer is about one hundred or greater than one hundred.

In one embodiment of the present invention, the first planarization process has a polishing endpoint determined by a variation in light reflection occurs on the interface of the top metal layer and the metal barrier layer. In one embodiment of the present invention, the polishing endpoint of the second planarization process is determined by a variation in light interferometry or an eddy current occurs on the interface of the insulator layer and the ILD layer. In one embodiment of the present invention, a white-light interferometer or an eddy current flow detector is utilized to determine the polishing endpoints.

In one embodiment of the present invention, before the top metal layer fills the opening, the method further comprises conducting a seeding deposition on the metal barrier layer. In one embodiment of the present invention, the metal barrier layer consists of Titanium nitride (TiN), Titanium (Ti), Tantalum nitride (TaN) or the arbitrary combinations thereof According to another aspect of the present invention, a method for manufacturing TSVs is further provided, wherein the method comprises several steps as follows: A stack structure having a substrate and an ILD layer is provided, in which an opening penetrating through the ILD layer and further extending into the substrate is formed. After an insulator layer and a metal barrier layer are formed on the stack structure, a top metal layer is then formed on the stack structure and fills the opening. A first planarization process stopping on the metal barrier layer is conducted to remove a portion of the top metal layer. A second planarization process stopping on the insulator layer is subsequently conducted to remove a portion of the top metal layer and a portion of the metal barrier layer, wherein the second planarization process has a polishing endpoint determined by a light interferometry or an eddy current. A third planarization process stopping on the ILD layer is conducted to remove a portion of the top metal layer, a portion of the metal barrier layer and a portion of the insulator layer, wherein the third planarization process has a polishing endpoint determined by a light interferometry or an eddy current.

In one embodiment of the present invention, the first planarization process comprises a CMP process having a polishing rate for removing the metal barrier layer less than a polishing rate for removing the top metal layer. In one embodiment of the present invention, the ratio of the polishing rate for removing the top metal layer to the polishing rate for removing the metal barrier layer is substantially greater than 2. In one embodiment of the present invention, the ratio of the polishing rate for removing the top metal layer to the polishing rate for removing the metal barrier layer is about one hundred or greater than one hundred.

In one embodiment of the present invention, the first planarization process has a polishing endpoint determined by a variation in light reflection occurs on the interface of the top metal layer and the metal barrier layer. In one embodiment of the present invention, the polishing endpoint of the second planarization process is determined by a variation in light interferometry or an eddy current occurs on the interface of the insulator layer and the metal barrier layer. In one embodiment of the present invention, the polishing endpoint of the third planarization process is determined by a variation in light interferometry or an eddy current occurs on the interface of the insulator layer and the ILD layer. In one embodiment of the present invention, a white-light interferometer or an eddy current flow detector is utilized to determine the polishing endpoints.

In one embodiment of the present invention, the method further comprises conducting a seeding deposition on the metal barrier layer before the top metal layer fills the opening. In one embodiment of the present invention, the metal barrier layer consists of Titanium nitride (TiN), Titanium (Ti), Tantalum nitride (TaN) or the arbitrary combinations thereof.

According to aforementioned embodiment of the present invention, a method in determining polishing endpoint of a planarization process by measuring a light reflection, a light interferometry or a motor current revealed from a layer which is subjected to a planarization process is applied for forming TSVs within a stack structure having a substrate and an ILD layer. In order to form the TSVs, at least one planarization process must be carried out to remove portions of an insulator layer, a metal barrier layer and a top metal layer subsequently formed on the ILD layer.

By these way, the polishing endpoint for removing the top metal layer can be precisely determined by measuring a light reflection, and the polishing endpoint for removing the insulator layer and the metal barrier layer layer can also precisely determined by measuring a light interferometry or a motor current during the planarization process. Accordingly, the planarization process can be stopped on theses layer precisely.

In addition, when the planarization process is divided into a plurality of polishing stages, and the polishing thickness can be controlled more delicately by applying the polishing endpoint deterring method in these polishing stages, whereby the polishing uniformity of the TSVs and the processing reliability during the wafer level packaging process can be enhanced.

In order to make the aforementioned and other objects, features and advantages of the present invention comprehensible, preferred embodiments accompanied with figures are described in detail below.

BRIEF DESCRIPTION OF THE DRAWINGS

The above objects and advantages of the present invention will become more readily apparent to those ordinarily skilled in the art after reviewing the following detailed description and accompanying drawings, in which.

DESCRIPTION OF EMBODIMENTS

Figure 1A:
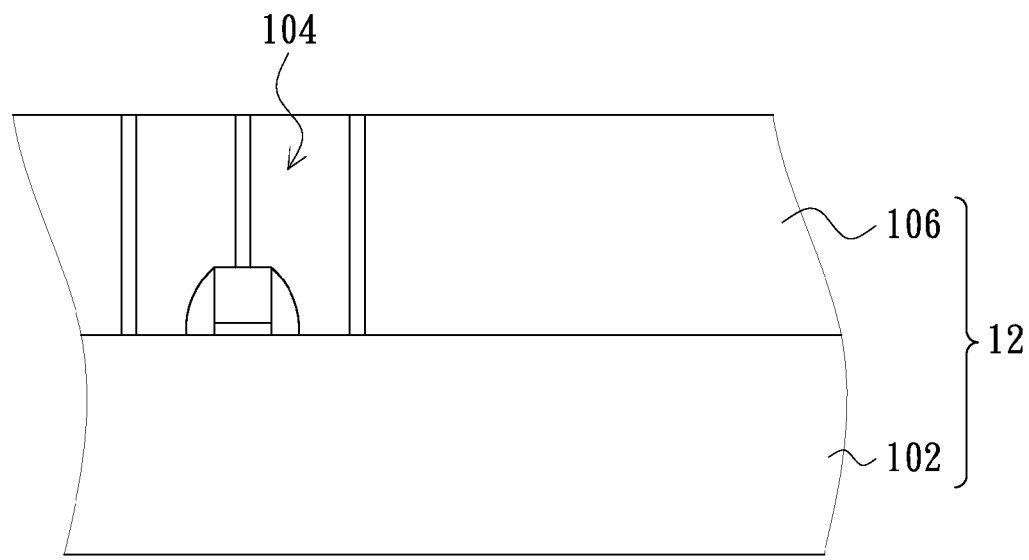
FIGS. 1A to 1E are cross sectional views illustrating of the process for manufacturing a TSV structure in accordance with one embodiment of the present invention.

Detail descriptions of several embodiments eligible to exemplify the features of making and using the present invention are disclosed as follows. It must be appreciated that the following embodiments are just exemplary, but not be used to limit the scope of the present invention. Wherever possible, the same reference numbers are used in the drawings and the description to refer to the same or like parts.

FIGS. 1A to 1E are cross sectional views illustrating the process for manufacturing a TSV structure 116 in accordance with one embodiment of the present invention. Referring to FIG. 1A, a stack structure 12 having a silicon substrate 102 and an ILD layer 106 is provided. Wherein the ILD layer 106 is formed on the substrate 102, and at least one electronic device 104, such as a conductive wire, a transistor, a diode, a resistor or a capacitor is formed in the ILD layer 106. The ILD layer 106 preferably is a low-k dielectric material consisting of silicon nitride (SiN), silicon oxynitride (SiCN), silicon carbide (SiC), silicon dioxide ($SiO_2$), undoped silicate glass (USG), Tetraethoxysliane (TEOS) or the arbitrary combinations thereof.

Figure 1B:
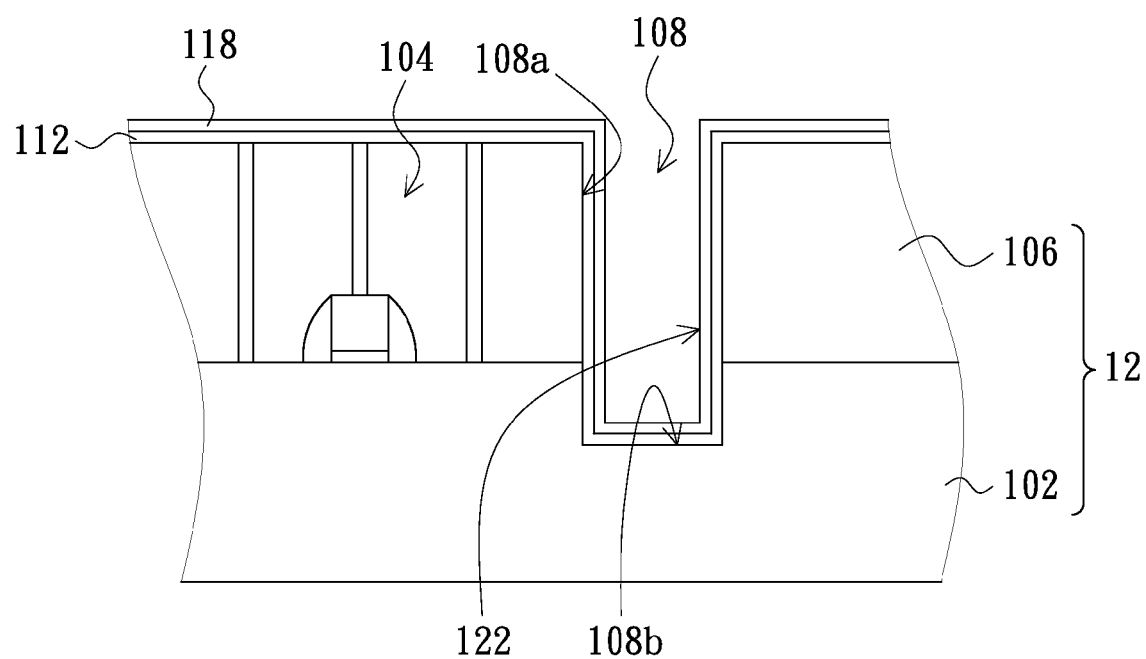

In addition, the stack structure 12 has an opening 108 formed therein. Referring to FIG. 1B, the opening 108 penetrates through the ILD layer 106, and further extends into a portion of the substrate 102. Next, an insulator layer 112 and a metal barrier layer 118 are formed sequentially on the stack structure 12, and the sidewalls 108b of the opening 108. In some embodiment of the present invention, the insulator layer 112 used to insulate the substrate 102 from the TSV structure 116 consists of dielectric materials, such as silicon oxide, silicon nitride or the combination thereof, and the metal barrier layer 118 consists of Titanium nitride (TiN), Titanium (Ti), Tantalum nitride (TaN) or the arbitrary combinations thereof.

Figure 1C:
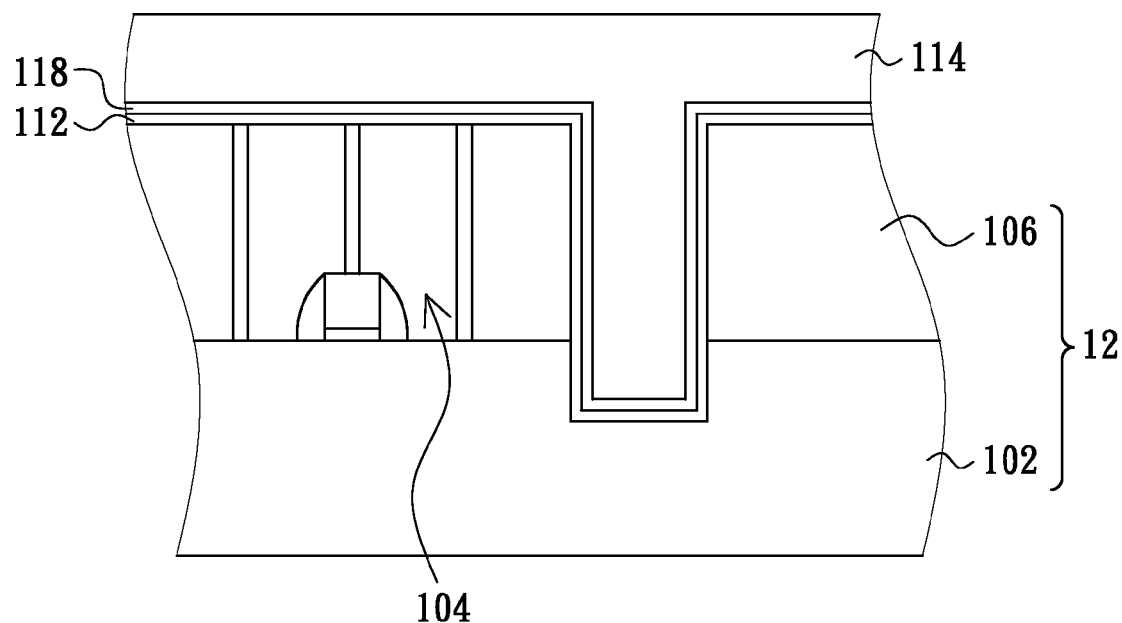
Figure 1D:
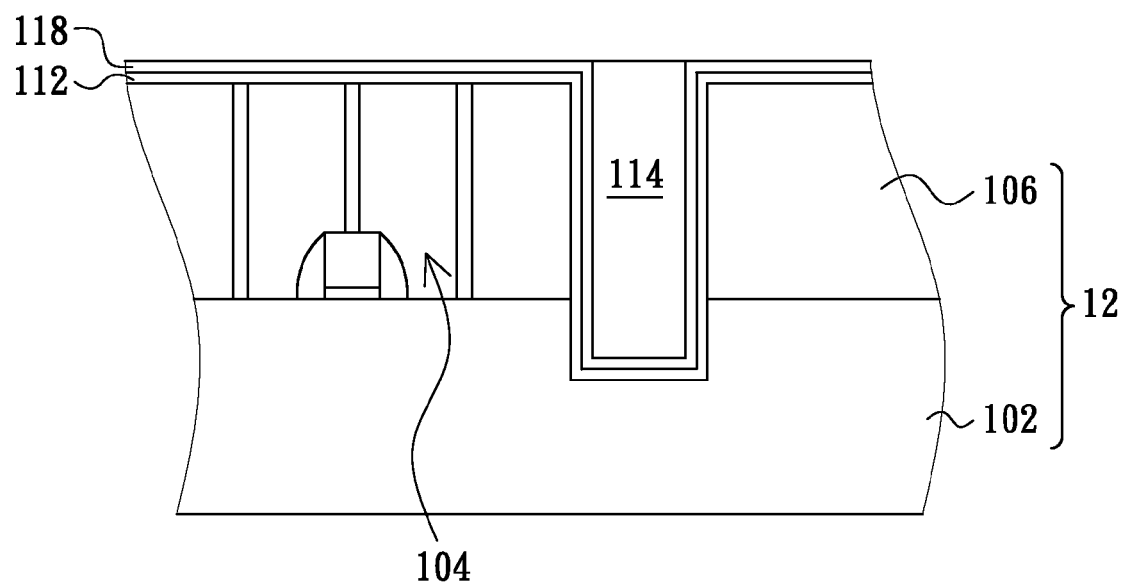

A metal filling process subsequently is conducted on the stack structure 12 to fulfill the opening 108 with a metal, such as copper (Cu) or aluminum (Al), and to form a top metal layer 114 on the metal barrier layer 118 (shown as FIG. 1C). In some embodiments of the present invention, a seeding layer 122 may be formed on the metal barrier layer 118 prior the metal filling process. The seeding layer 122 and the metal barrier layer 118 are preferably made of the same material. The seeding layer 122 preferably is an electroplated copper layer.

A first planarization process, for example a CMP process, is then conducted to remove the potion of the top metal layer 114 overlying the metal barrier layer 118, and the CMP process is then stopped on the metal barrier layer 118 (shown as FIG. 1D), wherein the slurry of the CMP process has different polishing rates for removing the metal barrier layer 118 and the top metal layer 114.

In some embodiments of the present invention, the polishing rate of the first planarization process for removing the metal barrier layer 118 is less than the polishing rate of the first planarization process for removing the top metal layer 114. Preferably, the ratio of the polishing rate for removing the top metal layer 114 to that for removing the metal barrier layer 118 is greater than 2. In the present embodiment the ratio is about one hundred or more than one hundred.

Generally, it is difficult to precisely determine a polishing endpoint of the traditional CMP process. For example, if the CMP process is predetermined to stop on the metal barrier layer 118 when the slurry confronts to the metal barrier layer 118, the CMP process however may not terminate immediately thereon but over polishes the metal barrier layer 118. In some embodiments of the present invention, the end point of the CMP process can be determined by an In-Situ Rate Monitor (ISRM) more easily and the CMP process can be manipulated to stop on the metal barrier layer 118 more precisely. Because of the metal barrier layer 118 and the top metal layer 114 has different corrosion resistance, manipulating the different polishing rates for removing the metal barrier layer 118 and the top metal layer 114 can make the polished metal barrier layer 118 and the retained top metal layer 114 have an equal level.

Alternatively, other approaches for determining the polishing endpoint of the CMP process can be provided. For example, the polishing endpoint of the first planarization process can be determined by a variation in light reflection occurs on the interface of the top metal layer 114 and the metal barrier layer 118.

In this case, an in-situ rate monitor (ISRM) is utilized to determine the polishing endpoints. Because each of the insulator layer 112, the metal barrier layer 118 and the top metal layer 114 can reveal different light reflection while irradiated with a red laser, thus when the interface of the top metal layer 114 and the metal barrier layer 118 is subjected to the planarization process, a variation in light reflection can be measured, and the first planarization process can be stopped at the interface of the top metal layer 114 and the metal barrier layer 118.

Figure 1E:
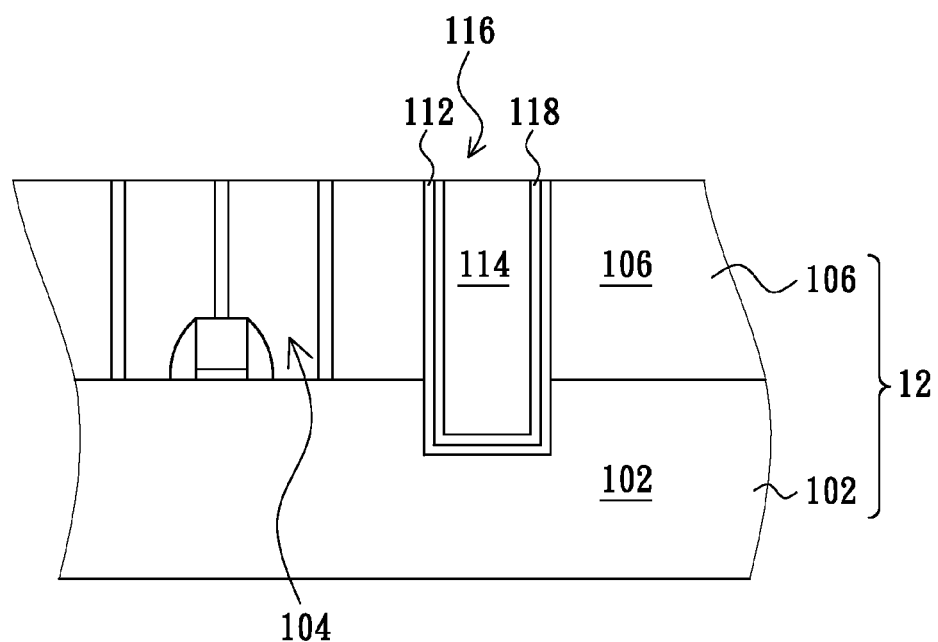

A second planarization process, for example an another CMP process, is then conducted to remove a portion of the metal barrier layer 118, a portion of the top metal layer 114 and a portion of the insulator layer 112, and the CMP process is then stopped on the ILD layer 106, meanwhile the TSV 116 is formed (shown as FIG. 1E).

The polishing endpoint of the second planarization process is determined by a light interferometry. Because each of the insulator layer 112, the metal barrier layer 118 and the top metal layer 114 can reveal different light interferometry while irradiated with a white light, thus when the interface of the insulator layer 112 and the ILD layer 106 is subjected to the planarization process, a variation in interferometry can be measured, and the second planarization process can be precisely stopped at the interface of the insulator layer 112 and the ILD layer 106. Therefore, the ILD layer 106 remaining in the opening 108 can be prevented from been over polished.

In the present embodiment, a White-Light interferometer is utilized to determine the polishing endpoints, wherein the polishing endpoint of the second planarization process is determined by a variation in light interferometry occurs on the interface of the insulator layer 112 and the ILD layer 106.

Alternatively, the polishing endpoints can be determined by a motor current revealed from the CMP apparatus. For example, because the metal polishing pads of the CMP apparatus may be subjected to different friction while CMP process is carried out on different layers, and the frictions can be converted into an eddy current, such that an eddy current variation can be measured when the CMP process is carried out on an interface of two adjacent layers. In other words, when the CMP process is carried out on an interface of the insulator layer 112 and the ILD layer 106, an eddy current flow detector can be used to measure the eddy current variation, thereby the second planarization process can be stopped at the interface of the insulator layer 112 and the ILD layer 106.

Besides, other motor current, such as magnetic resistance or the like, revealed from the CMP apparatus can be used to determine the polishing endpoint of the second planarization process.

Since the ISRM technology, the White-Light interferometer and the eddy current flow detector have been well known by those skilled in the art, the specification hereinafter will not redundantly describe the scheme and operating steps thereof in detail.

Figure 2A:
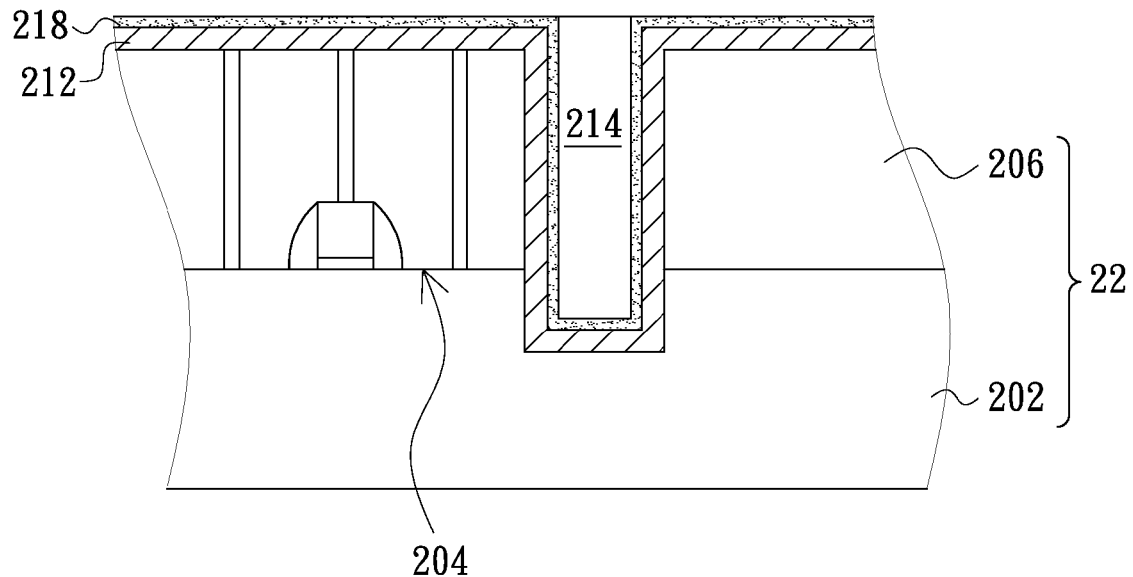
FIGS. 2A to 2C are cross sectional views illustrating the process for manufacturing a TSV structure in accordance with another embodiment of the present invention.
Figure 2B:
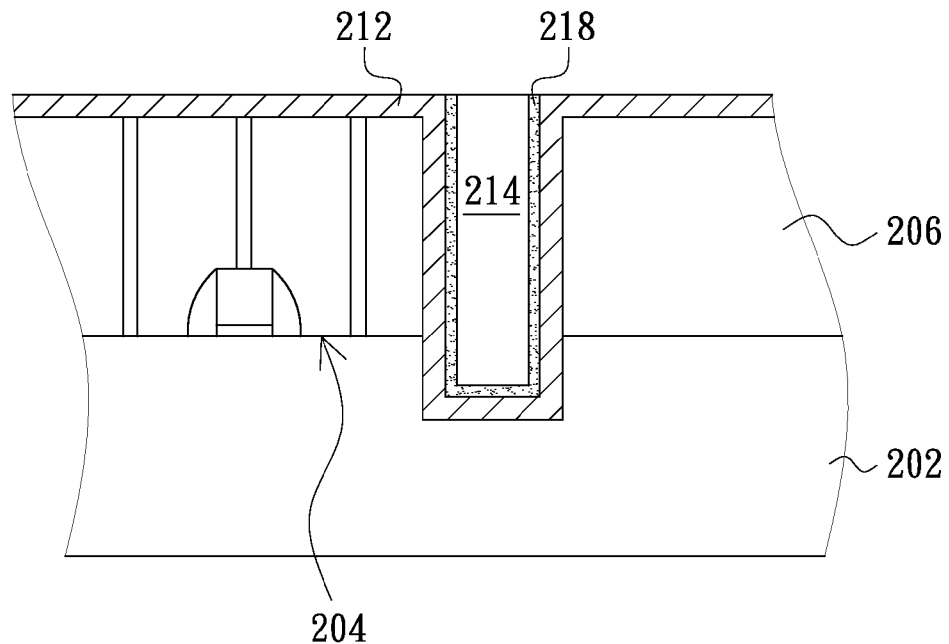
Figure 2C:
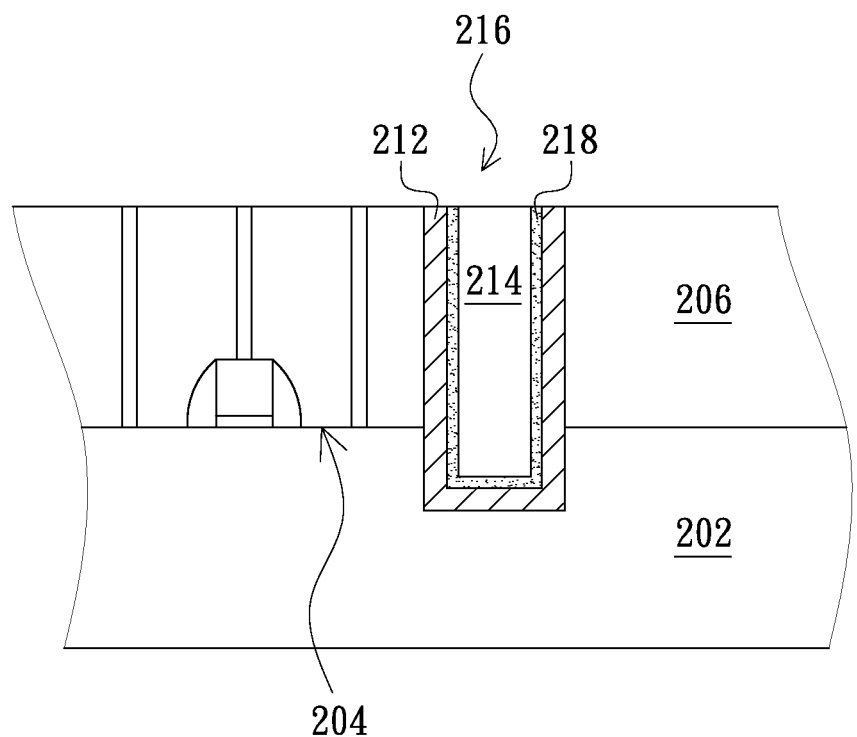

FIGS. 2A to 2C are cross sectional views illustrating the process for manufacturing a TSV structure 216 in accordance with another embodiment of the present invention. In the present embodiment the process is similar to the process illustrated in FIGS. 1A to 1E, the major difference between the two embodiments is the selection of the stop layer during the planarization process. The present embodiment is continued from FIG. 1C, and similar reference numbers are used to indicate similar elements.

Referring to FIG. 2A, a first planarization process, for example a CMP process, is then conducted to remove the potion of the top metal layer 214 overlying the metal barrier layer 218, and the CMP process is then stopped on the metal barrier layer 218, wherein the slurry of the CMP process has different polishing rate for removing the metal barrier layer 218 and the top metal layer 214. In the present embodiment, the polishing rate for removing the metal barrier layer 218 is less than the polishing rate for removing the top metal layer 214. Preferably, the ratio of the polishing rate for removing top metal layer 214 to the polishing rate for removing the metal barrier layer 218 is greater than 2. In the present embodiment the ratio is about one hundred or more than one hundred.

Alternatively, other approaches for determining the polishing endpoint of the CMP process can be provided. For example the polishing endpoint of the first planarization process can be determined by a variation in light reflection occurs on the interface of the top metal layer 214 and the metal barrier layer 218 by the ISRM.

After the first planarization process is carried out, a second planarization process, for example a second CMP process, is conducted to remove a portion of the metal barrier layer 218 overlying the insulator layer 212 and a portion of the top metal layer 214 retained in the opening 208, and the second CMP process is then stopped on the insulator layer 212 (shown as FIG. 2B). The polishing endpoint of the second planarization process is determined by a light interferometry. In the present embodiment, the polishing endpoint of the second planarization process is determined by a variation in light interferometry occurs on the interface of the insulator layer 212 and the metal barrier layer 218.

Subsequently, a third planarization process, for example a third CMP process, is conducted to remove a portion of the insulator layer 212 overlying the ILD layer 206 and portions of the metal barrier layer 218 and the top metal layer 214, to form the TSV 216 (shown as FIG. 2C), and the third planarization process is then stopped on the ILD layer 206. Like the second planarization process, the polishing endpoint of the third planarization process is determined by a light interferometry. In the present embodiment, the polishing endpoint of the third planarization process is determined by a variation in light interferometry occurs on the interface of the insulator layer 212 and the ILD layer 206.

Similarly, the polishing endpoints of the second planarization process and the third planarization process set forth in the aforementioned embodiments can also be determined by measuring the eddy current variation respectively occurs on the interface of the insulator layer 212 and the metal barrier layer 218 and the interface of the insulator layer 212 and the ILD layer 206.

Figure 3A:
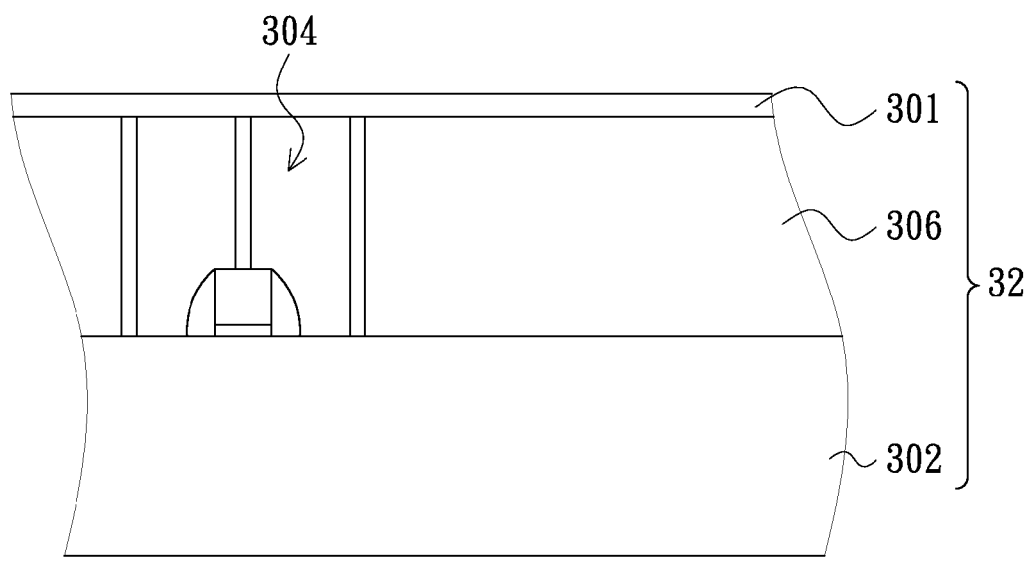
FIGS. 3A to 3G illustrate cross sections of the process for manufacturing a TSV structure in accordance with the third embodiment of the present invention.

FIGS. 3A to 3G illustrate cross sections of the process for manufacturing a TSV structure 316 in accordance with another embodiment of the present invention. Referring to FIG. 3A, a stack structure 32 having a silicon substrate 302, a ILD layer 306 and a dielectric stop layer 301 is provided. Wherein the ILD layer 306 is formed on the substrate 302, and the ILD layer 306 has at least one electronic device 304, such as a conductive wire, a transistor, a diode, a resistor or a capacitor formed therein. The ILD layer 306 preferably is a low-k dielectric material consisting of SiN, SiCN, SiC, SiO2, USG, TEOS or the arbitrary combinations thereof; the dielectric stop layer 301 preferably consisting of SiN, SiCN, SiC or the arbitrary combinations thereof is formed on the ILD layer 306.

Figure 3B:
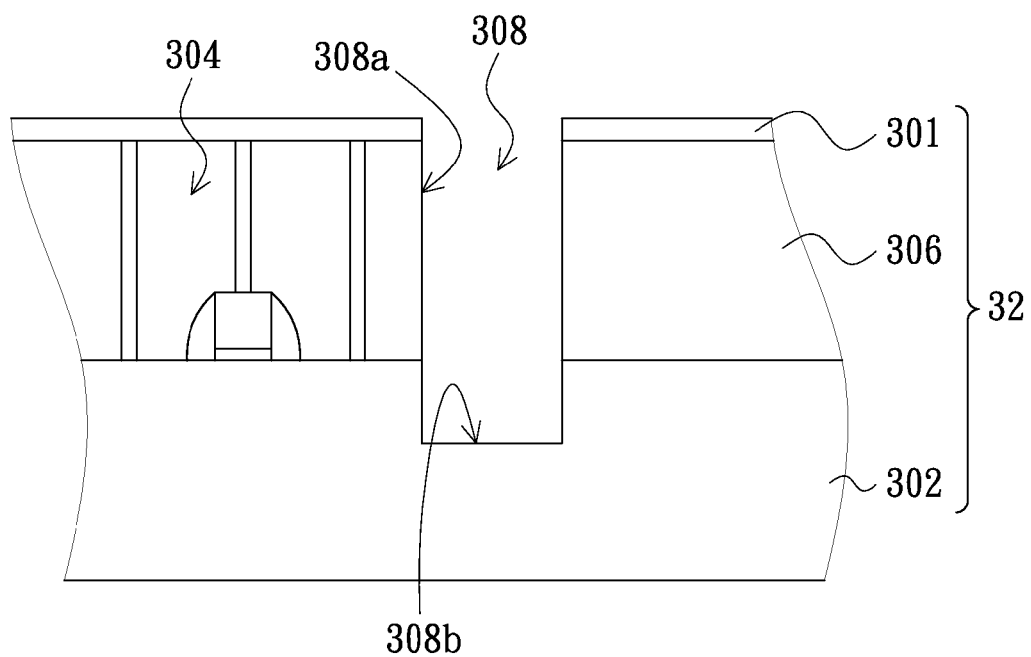
Figure 3C:
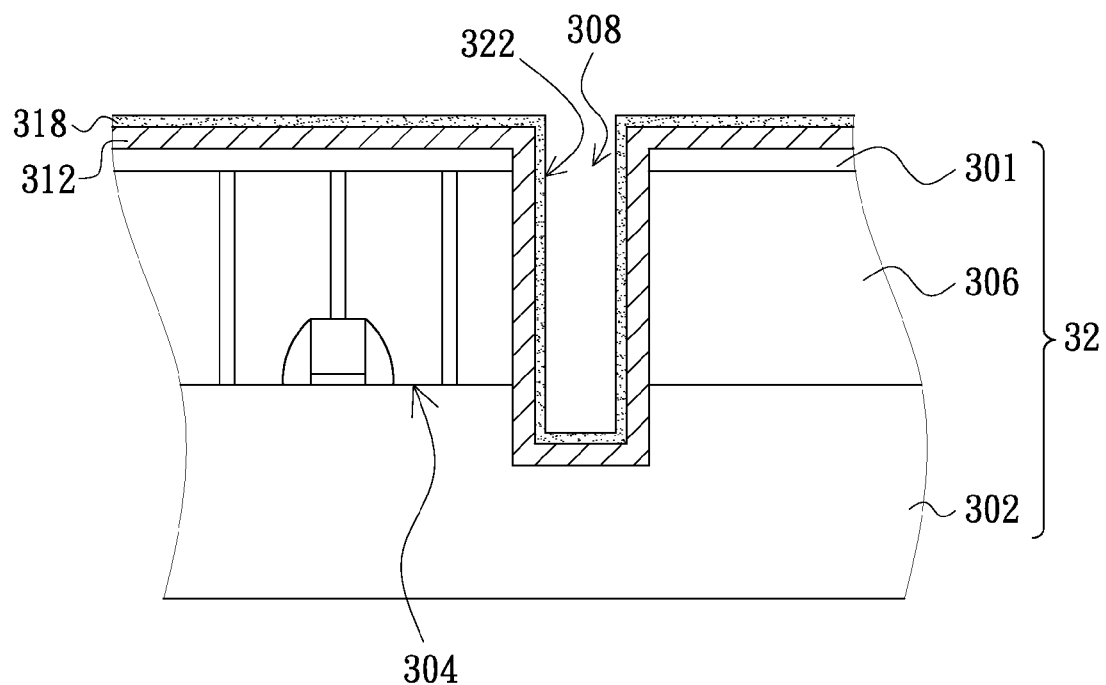

An opening 308 is then formed in the stack structure 32. Referring to FIG. 3B, the opening 308 penetrates through the planarization stopping layer 301 and the ILD layer 306, and further extends into a portion of the substrate 302. Subsequently, an insulator layer 312 and a metal barrier 318 are sequentially formed on the dielectric stop layer 301 and the sidewalls 308a and the bottom 308b of the opening 308 (shown as FIG. 3C). In the present embodiment, the insulator layer 312 used to insulate the substrate 302 from the TSV structure 316 consists of dielectric materials, such as silicon oxide, silicon nitride or the combination thereof, and the metal barrier 318 consists of TiN, Ti, TaN or the arbitrary combinations thereof.

Figure 3D:
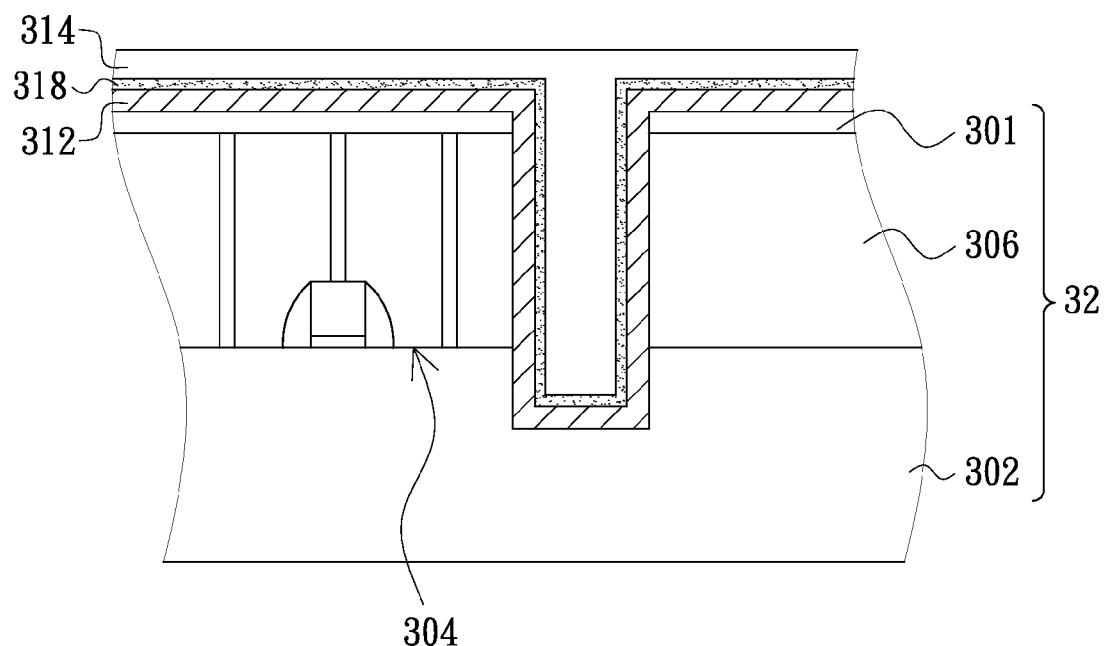
Figure 3E:
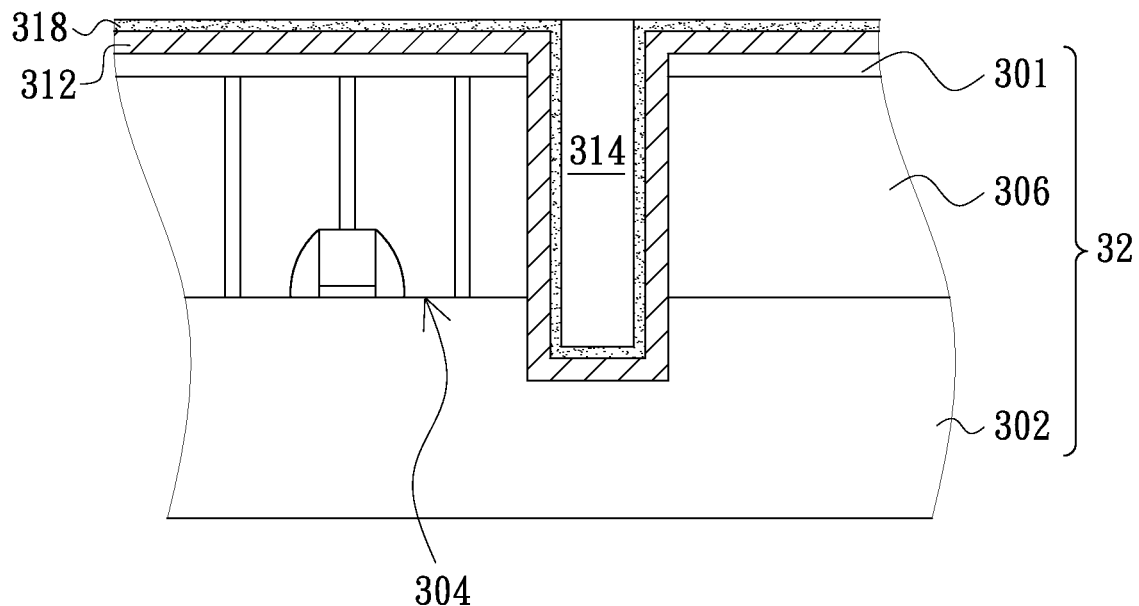
Figure 3F:
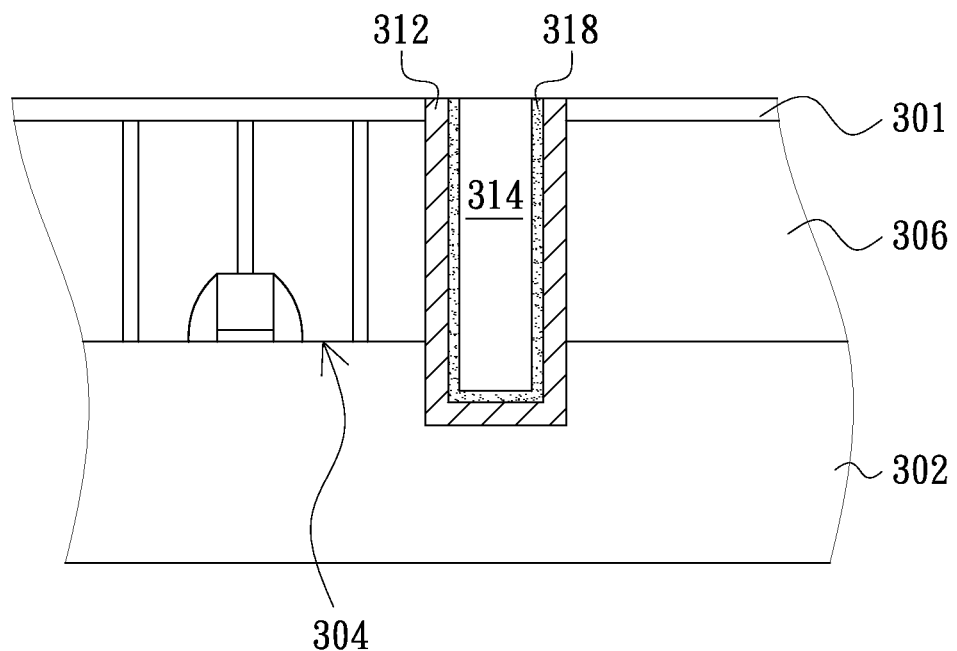

After that, a metal filling process, such as a electroplating process, is conducted on the stack structure 32 to fulfill the opening 308 with a metal, such as Cu or Al, and to form a top metal layer 314 on the metal barrier 318 (shown as FIG. 3D). In some embodiments of the present invention, a seeding layer 322 may be formed on the metal barrier 318 prior the metal filling process is conducted. The seeding layer 322 and the metal barrier layer 318 are preferably made of the same material. The seeding layer 322 preferably is an electroplated copper layer.

A first planarization process, for example a CMP process, is then conducted to remove the potion of the top metal layer 314 covering on the metal barrier 318 (shown as FIG. 3E), and the CMP process is then stopped on the metal barrier 318, wherein the slurry of the CMP process has different polishing rate for removing the metal barrier 318 and the top metal layer 314.

In the present embodiment, the polishing rate for removing the metal barrier 318 is less than the polishing rate for removing the top metal layer 314. Preferably, the ratio of the polishing rate for removing top metal layer 314 to the polishing rate for removing the barrier layer 318 is greater than 2. In the present embodiment the ratio is about one hundred or more than one hundred.

After the first planarization process, a second planarization process, for example a second CMP process, is conducted to remove a portions of the metal barrier 318, a portions of the insulator layer 312 covering on the dielectric stop layer 301 and a portion of the top metal layer 314 (shown as FIG. 3F), and the second CMP process is then stopped on the dielectric stop layer 301, wherein the slurry of the second CMP process has different polishing rates for removing the dielectric stop layer 301 and the insulator layer 312. In the present embodiment, the polishing rate for removing the dielectric stop layer 301 is less than the polishing rate for removing the insulator layer 312. Besides, the polishing rate for removing the dielectric stop layer 301 is also less than each of the polishing rate for removing the metal barrier 318 and the top metal layer 314. Preferably, the ratio of the polishing rate for removing the insulator layer 312 to that for removing the dielectric stop layer 301 is substantially greater than 2.

Figure 3G:
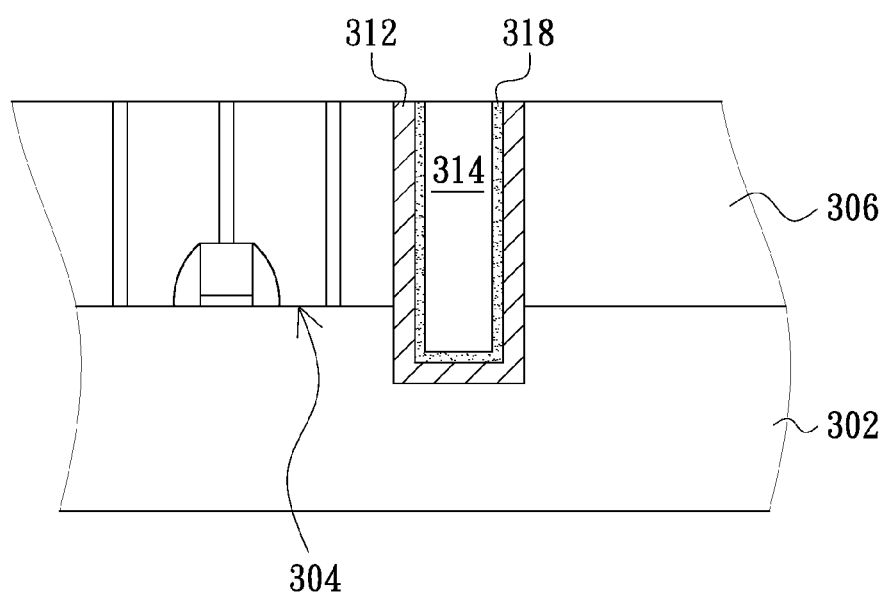

Subsequently, a third planarization process, for example a third CMP process, is conducted to remove the dielectric stop layer 301 and portions of the metal barrier 318, the insulator layer 312 and the top metal layer 314, to form the TSV 316 (shown as FIG. 3G).

In the present embodiment, the third CMP process is then stopped on the ILD layer 306, and the slurry of the third CMP process has a polishing rate for removing the dielectric stop layer 301 greater than that for removing the ILD layer 306. Preferably, the ratio of the polishing rate for removing the dielectric stop layer 301 to that for removing the ILD layer 306 is substantially greater than 2.

According to aforementioned embodiment of the present invention, an method in determining polishing endpoint of a planarization process by measuring a light reflection, a light interferometry or an eddy current revealed from a layer which is subject to a planarization process is applied for forming TSVs in a stack structure having a substrate and an ILD layer. In order to form the TSVs, at least one planarization process must be carried out to remove portions of an insulator layer, a metal barrier layer and a top metal layer subsequently formed on the ILD layer.

By these way, the polishing endpoint for removing the top metal layer can be precisely determined by measuring a light reflection, and the polishing endpoint for removing the insulator layer and the metal barrier layer can also precisely determined by measuring a light interferometry or a motor current during the planarization process. Accordingly, the planarization process can be stopped on theses layer precisely.

In addition, when the planarization process is divided into a plurality of polishing stages, and the polishing thickness can be controlled more delicately by applying the polishing endpoint deterring method in these polishing stages, whereby the polishing uniformity of the TSVs and the processing reliability during the wafer level packaging process can be enhanced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for manufacturing a through-silicon via (TSV), the method comprising:
   providing a stack structure having a substrate and an internal layer dielectric (ILD) layer, wherein an opening is formed in the stack structure penetrating through the ILD layer and further extending into the substrate;
   providing a insulator layer and a metal barrier layer sequentially formed on the stack structure and the sidewalls of the opening;
   providing a top metal layer formed on the stack structure and filling the opening;
   conducting a first planarization process stopping on the metal barrier layer to remove a portion of the top metal layer, and
   conducting a second planarization process stopping on the ILD layer to remove portions of the top metal layer, the metal barrier layer and the insulator layer, wherein the second planarization process has a polishing endpoint determined by a light interferometry or a motor current.

2. The method of claim 1, wherein the first planarization process comprises a chemical mechanical polishing (CMP) process having a polishing rate for removing the metal barrier layer less than a polishing rate for removing the top metal layer.

3. The method of claim 2, wherein the ratio of the polishing rate for removing the top metal layer to the polishing rate for removing the metal barrier layer is substantially greater than 2.

4. The method of claim 2, wherein the ratio of the polishing rate for removing the top metal layer to the polishing rate for removing the metal barrier layer is about one hundred or greater than one hundred.

5. The method of claim 1, wherein the first planarization process has a polishing endpoint determined by a variation in light reflection occurs on the interface of the top metal layer and the metal barrier layer.

6. The method of claim 5, wherein the polishing endpoint of the second planarization process is determined by a variation in light interferometry or an eddy current occurs on the interface of the insulator layer and the ILD layer.

7. The method of claim 6, wherein a white-light interferometer or an eddy flow detector is utilized to determine the polishing endpoints.

8. The method of claim 1, wherein before the top metal layer is filled in the opening, the method further comprises conducting a seeding deposition on the metal barrier layer.

* * * * *